(12) United States Patent
Weldon

(10) Patent No.: US 6,447,370 B1
(45) Date of Patent: Sep. 10, 2002

(54) INLINE METROLOGY DEVICE

(75) Inventor: Matthew Weldon, Phoenix, AZ (US)

(73) Assignee: SpeedFam-IPEC Corporation, Chandler, AZ (US)

( * ) Notice: Subject to any disclaimer, the term of this patent is extended or adjusted under 35 U.S.C. 154(b) by 0 days.

(21) Appl. No.: 09/836,789

(22) Filed: Apr. 17, 2001

(51) Int. Cl.⁷ .............................................. B24B 51/00
(52) U.S. Cl. ............................................. 451/6; 451/41
(58) Field of Search ............................ 451/6, 5, 8, 28, 451/41

(56) References Cited

U.S. PATENT DOCUMENTS

| | | | |
|---|---|---|---|
| 4,710,642 A | 12/1987 | McNeil | |
| 5,337,150 A | 8/1994 | Mumola | |
| 5,364,340 A | 11/1994 | Coll | |
| 5,555,474 A | 9/1996 | Ledger | |
| 5,835,225 A | 11/1998 | Thakur | |
| 5,889,593 A | 3/1999 | Bareket | |
| 5,947,802 A * | 9/1999 | Zhang et al. | 451/334 |
| 6,110,011 A * | 8/2000 | Somekh et al. | 451/28 |
| 6,244,931 B1 * | 6/2001 | Pinson et al. | 451/339 |
| 6,247,998 B1 * | 6/2001 | Wiswesser et al. | 451/41 |
| 6,276,989 B1 * | 8/2001 | Campbell et al. | 451/10 |
| 6,309,279 B1 * | 10/2001 | Bowman et al. | 451/288 |

* cited by examiner

Primary Examiner—Joseph J. Hail, III
Assistant Examiner—Hadi Shakeri
(74) Attorney, Agent, or Firm—Snell & Wilmer LLP

(57) ABSTRACT

The present invention provides a method of presenting a wafer to a metrology device for measuring surface characteristics of the wafer. In accordance with one aspect of the present invention, the metrology device is physically integrated with the wafer processing machine between two wafer processing stations. The metrology device measures the uniformity and or thickness of the wafer. In the preferred embodiment, the measuring device is a single wavelength multi-angle reflectometry device. The device comprises a light source provided from multiple emission points. In the preferred embodiment, the light source comprises a laser and the emission point comprise fiber optic cabling.

In accordance with yet another aspect of the present invention, a wafer location means is provided to track the position of the wafer passing over the wafer measurement device. Preferably, the tracking device comprises a light curtain comprising a light beam which detects when the wafer is entering the measuring device and suitably enables the tracking of the location of the wafer.

20 Claims, 5 Drawing Sheets

INLINE METROLOGY DEVICE

BACKGROUND OF THE INVENTION

1. Technical Field

The present invention relates generally to a method and apparatus for measuring physical characteristics of a surface, and, more particularly, to integrated methods and apparatus for measuring thin film thickness and uniformity across the surface of a wafer.

2. Background of the Invention

Various forms of wafers are well known in industry. As is generally known in the electronics industry, wafers are often used to store information and perform functions, particularly in the area of integrated circuits. Examples of common wafers include semiconductor wafers, magnetic disks, optical disks or other work pieces and are generally in the form of a flat, substantially planar disk.

The processes for manufacturing the wafers are also well known. For example, manufacturing a semiconductor wafer might include slicing a wafer from a silicon ingot and then polishing, cleaning, rinsing, and drying the wafer to remove any debris from the surface of the wafer. The polishing, cleaning and planarization may be performed on a typical chemical mechanical planarization (CMP) machine such as the machine shown in FIG. 1. For example, the illustrated CMP machine has various stations for the polishing, cleaning and rinsing of the wafer.

The wafers, in particular, semiconductor wafers, must be planarized and polished to remove excess material and imperfections and to achieve desired electrical properties. Similarly, in the manufacture of optical disks, removal of debris on the surfaces of the disks is important because the debris can cause voids in recorded information on the disks. At each step of the process, as imperfections and debris are reduced or eliminated, the wafers become increasingly more valuable. For example, a typical silicon wafer, prior to any processing, may cost $80–500. However, after the wafer has been planarized, polished and cleaned, it is often worth $20,000–$80,000 or more.

It is also important to measure uniformity and thickness of the wafers at various stages in the CMP process in order to ensure the quality of the finished wafers. More efficient and rapid acquisition of information is needed to control the CMP process, and the ability to use the information to optimize the performance of a particular polish tool, the ability to minimize rework and prevent generation of scrap wafers due to mis-processing is becoming increasingly important. Thus, CMP process control requires frequent, if not continual measurement to verify that the desired material removal is occurring and to ensure that acceptable wafer uniformity exists.

Metrology devices are generally required to perform the wafer measurements and are often performed using optical means. The metrology devices typically operate by directing light at the surface to be measured and measure the characteristics (e.g., intensity, angle of reflection, defraction, scattering, etc.) of the light reflected from the surface. The characteristics are then used to calculate various properties of the thin film covering the wafer surface, such as, the index of refraction, extinction coefficient, and thickness of the thin film. Exemplary of existing metrology units include the Nanospec 9000™ manufactured by Nanometrics™, the Thermawave 3260 manufactured by ThermaWave, and the UV1050 manufactured by KLA-Tencor.

Typically, metrology devices such as these comprise separate and distinct stations apart from the main CMP tool. This requires that the wafers be transported to the metrology station for measurement. However, use of separate stations has various undesirable consequences when implemented in CMP processes. For example, it is often economically desirable to increase the speed of the wafer manufacturing operations in order to increase throughput. Stated otherwise, wafer manufacturers aspire to process a greater number of wafers in a smaller amount of time and at a lower cost. Thus, the speed of the device transporting the wafers from station to station (e.g., from polishing stations to metrology stations) might be increased. Nonetheless, the additional transport steps to the metrology stations still lowers the overall throughput of wafers irrespective of speed increases.

Further, every time a wafer is "handled," for example, by the end effector (the device which contacts the wafer during transport), there is an increased possibility for introducing additional defects to the wafer. Wafer manufacturers attempt to reduce the effects of additional handling steps by sampling wafers. That is, rather than measuring every wafer processed, one wafer from a predetermined number of wafers (a sample) is measured and statistical methods are used to determine whether the wafers which have not been measured are within tolerances. Unfortunately, sampling the wafers still slows the manufacturing process to some extent and leaves the risk that some wafers which are not measured do not fall within desired tolerances.

Thus, integrating existing metrology devices with CMP equipment so that fewer wafer transport steps are required has been considered. However, until the present invention, so doing has not previously been possible. This is at least in part because using existing metrology devices, the mechanical integration of the device with existing CMP equipment is complex, costly and time consuming. As mentioned above, additional wafer transporting equipment is thus necessary, throughput is reduced and the potential of adding defects is increased.

Accordingly, because increased throughput of processed wafers is generally desired and because the risk of adding imperfections and defects to the wafers as the amount of handling is increased, methods and apparatus to measure the uniformity and thickness of the wafers in a manner which minimizes any need for additional processing steps are desirable.

SUMMARY OF THE INVENTION

The present invention provides methods and apparatus for presenting a wafer to a metrology device for measuring thin film characteristics. In accordance with one embodiment of the present invention, a metrology device is integrated with a CMP tool such that various wafer measurements can be automated while minimizing additional handling of wafers processed by the CMP tool. For example, a metrology device may be integrated between stations within a CMP process tool. As a wafer transfer device moves a wafer from an index load cup of the CMP tool or as wafers are drawn from a spinner, the transfer device and wafer may pass by or over the metrology device. As the wafers pass across the device, moving from station to station, the device measures finite points on the wafer surface. The measurements are used to calculate various physical characteristics of the wafer surface. For example, uniformity and mean film thickness of the wafer may be determined. Thus, as the wafer transfer device moves wafers from station to station, the wafer is presented to the metrology device with no substantial decrease in the throughput of wafers.

In accordance with another aspect of the present invention, the metrology device comprises a light source provided from multiple emission points configured in an array or multiple arrays. When using multiple output arrays, the arrays are preferably arranged side by side and substantially parallel to allow the measurement of multiple points on the wafer surface increasing accuracy of the measurement of the wafer surface.

In accordance with yet another aspect of the present invention, a wafer location means is provided to track the position of the wafer passing over the wafer measurement device. Preferably, the tracking device comprises a curtain comprising a light beam and photoelectric cell detects when the wafer is entering and/or leaving the measuring device and suitably enables the tracking of the location of the wafer. Combining multiple sensors, and means for sensing the wafer's position, preferably independent from the CMP process tool's wafer handling system, thereby increase the speed of measurement and ease integration of the device into a process tool.

BRIEF DESCRIPTION OF THE DRAWINGS

Additional aspects of the present invention will become evident upon reviewing the non-limiting embodiments described in the specification and the claims taken in conjunction with the accompanying figures, wherein like numerals designate like elements, and:

DETAILED DESCRIPTION OF EXEMPLARY EMBODIMENTS

Figure 1:
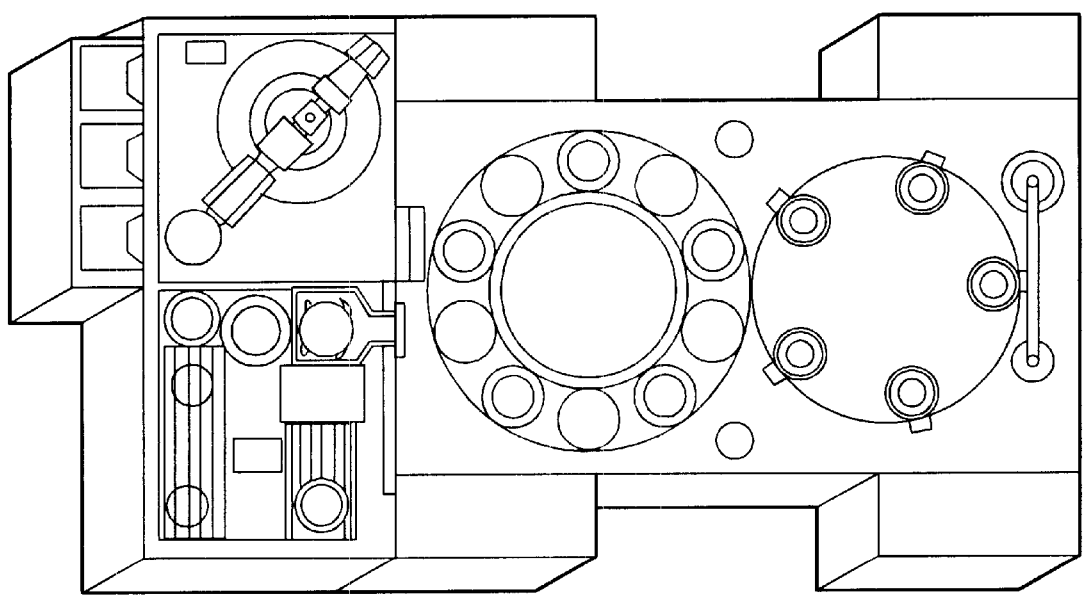
FIG. 1 is top view of a typical CMP tool.

The following descriptions are of exemplary embodiments of the invention only, and are not intended to limit the scope, applicability, or configuration of the invention in any way. Rather, the following description provides convenient illustrations for implementing different embodiments of the invention. As will become apparent, various changes may be made in the function and arrangement of the elements described in these embodiments without departing from the spirit and scope of the invention as set forth in the appended claims. For example, though the following description refers mainly to the measurement of silicon wafers, the device of the present invention may likewise be employed in various other wafer processing operations such as in the processing of optical discs. Similarly, though the following description refers to measuring thickness and uniformity of thin films, other physical characteristics such as extinction coefficient and index of refraction may likewise be measured.

Thus, in general, in accordance with the present invention, a device for measuring various characteristics of a wafer is suitably integrated into a CMP tool between various stations on the tool to, for example, in accordance with one aspect of the present invention, measure the uniformity and/or thickness of the wafer. Preferably, the measuring device suitably comprises a metrology device (or devices) located between various wafer processing stations of a CMP machine, thereby allowing integrated in-line measurement of the surface characteristics of wafers processed by the CMP machine.

In accordance with a preferred embodiment, the integrated metrology device consists of several photodiodes, such as the PDC 24s-MU available from Detection Technology, Inc. of Finland, each illuminated by a point source at a distinct angle of incidence. The measurement of light intensity reflected from a film surface at multiple angles of incidence allows the determination of a number of thin film characteristics. It should be appreciated that other metrology devices and methods now known or as yet to be developed may be used in the application of the present invention and still fall within the scope of the present invention. Collection of such information from a large number of points across the wafer allow determination of the mean wafer characteristics of interest to a CMP tool user.

As mentioned briefly above, various measurement techniques exist for the determination of the desired thin film information. For example, multiple wavelength reflectometry, angle reflectometry, ellipsometry or any combination of these techniques may be used by metrology devices that have been integrated in accordance with present invention. In the exemplary embodiments described herein, the metrology devices preferably employ single wavelength multiple angle reflectometry.

In accordance with another aspect of the present invention, the measuring device, in the presently described embodiment, is used in a dry metrology system. That is, the surface characteristics of the wafers are measured in a substantially dry environment. However, in accordance with various alternative embodiments of the present invention, the metrology device may be integrated in a wet environment, i.e., when the wafer is still wet from immersion in the water and/or solvents used during the processing of the wafer.

Figure 2:
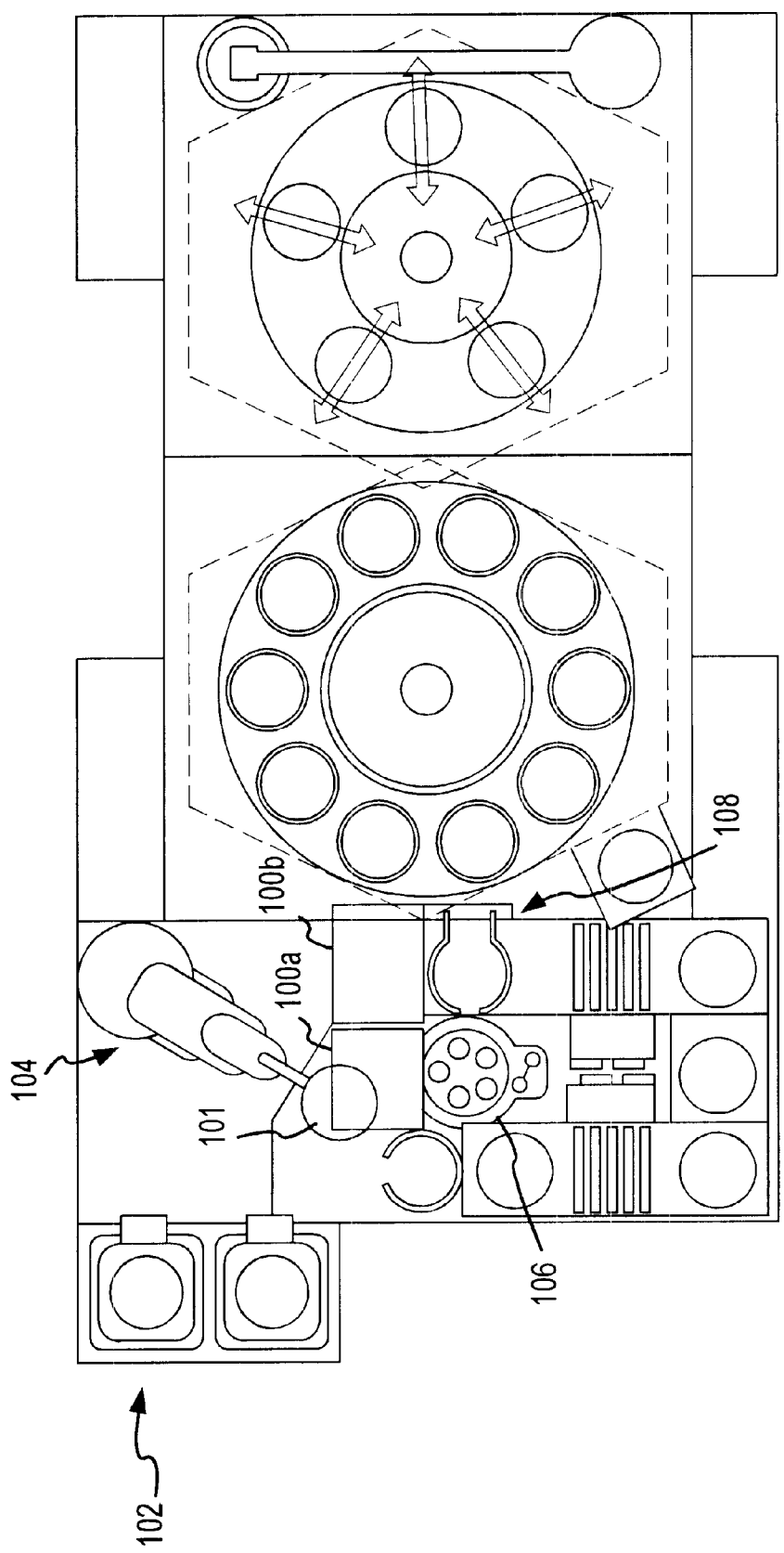
FIG. 2 is top view of a CMP tool incorporating integrated measuring devices in accordance with the present invention.
Figure 3:
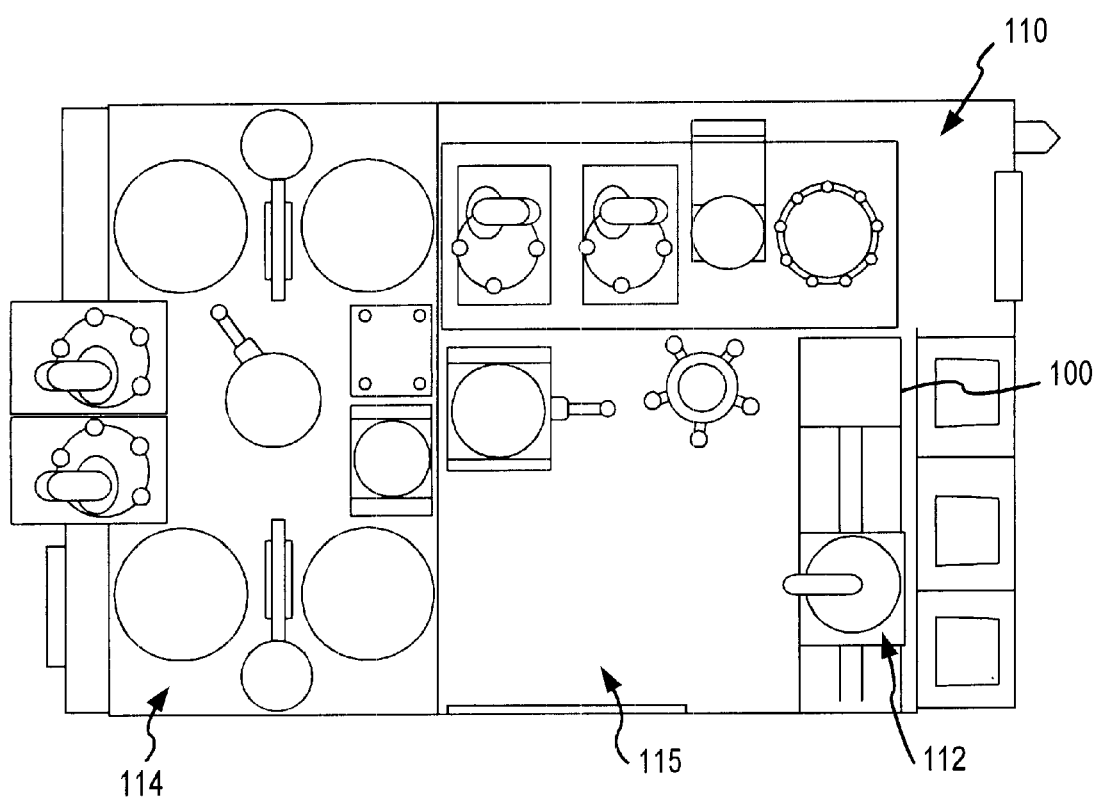
FIG. 3 is top view of an alternative CMP tool incorporating integrated measuring devices in accordance with an alternative embodiment of the present invention.

Now, with reference to FIGS. 2 and 3, in accordance with an exemplary embodiment of the present invention, metrology devices 100a,b are shown placed between various stations on CMP machines such as the Auriga-C CMP machine manufactured by Speedfam-IPEC, Inc. and the 776 also manufactured by Speedfam-IPEC, Inc.

For example, in the exemplary embodiment illustrated in FIG. 2, a CMP tool such as the Auriga-C comprises areas and stations such as a wafer cassette 102 for loading/unloading wafers 101, a robotic arm transport 104 for transporting the wafers 101 to various stations such as a spinner 106 for wafer drying, and an index table load station 108. In the illustrated embodiment, a metrology device 100a is integrated in a post-polishing location such as between spinner 106 and cassette 102. In this configuration, as transport arm 104 moves wafer 101 from cassette 102 to spinner 106, for wafer 101 is suitably presented to device 100 such that wafer 101 is passed across device 100a. When wafer 101 is passed across it, device 100a suitably measures the surface of wafer 101 using conventional metrology techniques. Such a configuration thus allows the capture of post-polish data during processing of wafer 101 to monitor and control the CMP tool's behavior with no substantial reduction in the number of wafers processed.

In accordance with another aspect of the present exemplary embodiment, if pre-polish information is desired, for example, to further refine the process parameters of the CMP tool for a particular wafer's characteristics, additional metrology devices may be integrated to the CMP tool. For example, metrology device 100b may be integrated in a location such as between cassette 102 and index table load station 108. With this configuration, collection of pre-polish data from wafer 101 without requiring additional wafer handling steps or substantially impacting the system's throughput is attainable.

In accordance now with an alternative embodiment of the present invention and with reference to FIG. 3, a CMP tool such as the 776 comprises areas and stations such as a cleaner 110, a polish module 114 and a transfer arm 112 for transferring wafers 101 between cleaner 110, polish module 114 and wafer cassettes 102 (such as those illustrated in FIG. 2). In this illustrated embodiment, metrology device 100 is integrated between cleaner 110 and the pre-polish module staging area 115 such that wafers 101 taken from wafer cassettes 102, prior to being delivered to polish module 114, pass over or across metrology device 100 to suitably measure the surface characteristics of wafer 101. Similarly, wafers 101 taken from the cleaner 110 (post polish) may also be passed over or across the metrology device 100 prior to being returned from their cassette of origin.

Figure 4:
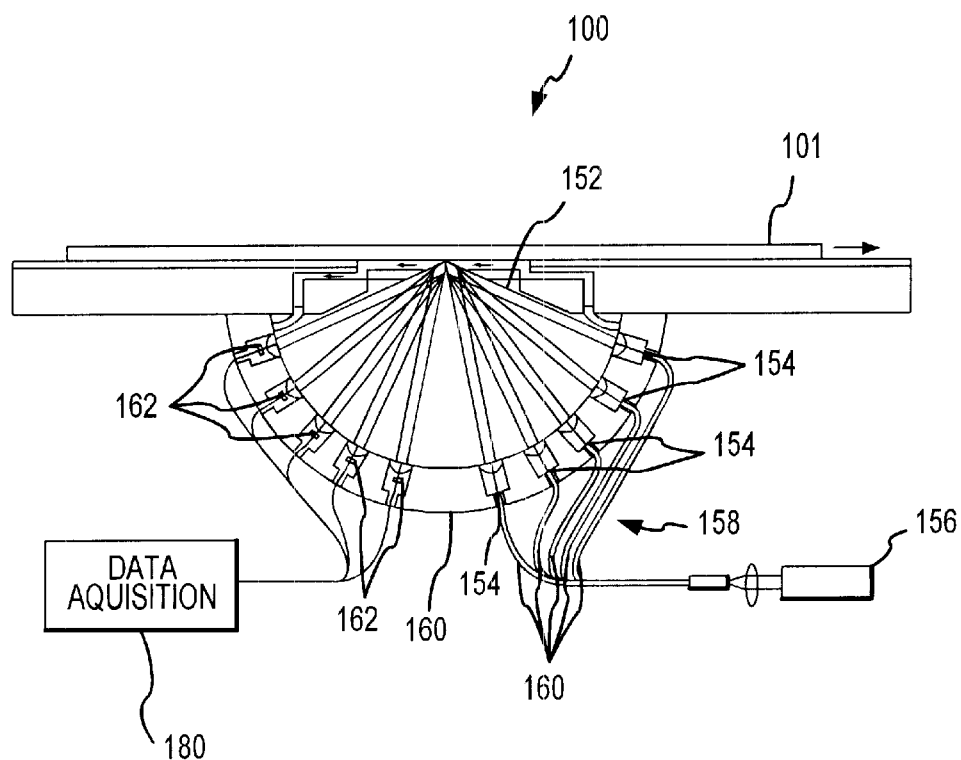
FIG. 4 is a side view of an in-line metrology device for measuring the lower surface of a wafer in accordance with the present invention.

An exemplary embodiment of a configuration of a metrology device 100 in accordance with the present invention is illustrated in FIG. 4. In the illustrated embodiment, metrology device 100 comprises a plurality of light emission points which direct the light from metrology device 100 to wafer 101 and a plurality of photodiode sensors which receive the light reflected from wafer 101 and send a signal to a processor which determines the characteristics of wafer 101.

In accordance with one aspect of the present exemplary embodiment, emission points preferably comprise a plurality of laser light outputs 154. Laser outputs 154 are suitably connected to a laser 156 or other light source. In the preferred embodiment, laser 156 and outputs 154 are suitably connected by a fiber bundle 158. Fiber bundle 158 preferably comprises a plurality of fiber optic cable 160, ideal for direction of laser energy. Of course, alternatively, in accordance with various embodiments of the present invention, rather than connection of outputs 154 and laser 156 through fiber bundle 158, lasers 156 may be directly connected to outputs 154. Additionally, though the present invention is described with respect to multiple laser sources, single laser sources may likewise be employed. Additionally, it should be appreciated by one skilled in the art that the light sources need not be laser, but may likewise comprise other light sources, such as a tungsten bulb or white light LED.

In the presently described exemplary embodiments of device 100, outputs 154 are preferably arranged in a suitably arc shaped array 160 though the arc shape is merely illustrative, and alternative configurations, such as a linear arrangement may likewise be used and still fall within the ambit of the present invention.

Figure 5:
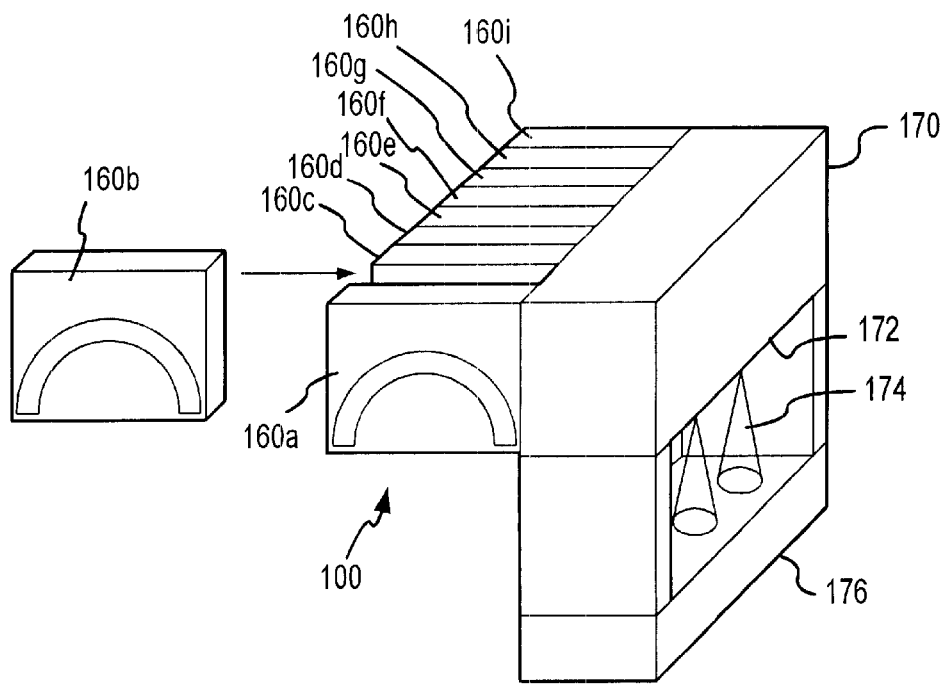
FIG. 5 is a perspective view of an in-line metrology device for measuring the upper surface of a wafer in accordance with the present invention.
Figure 6:
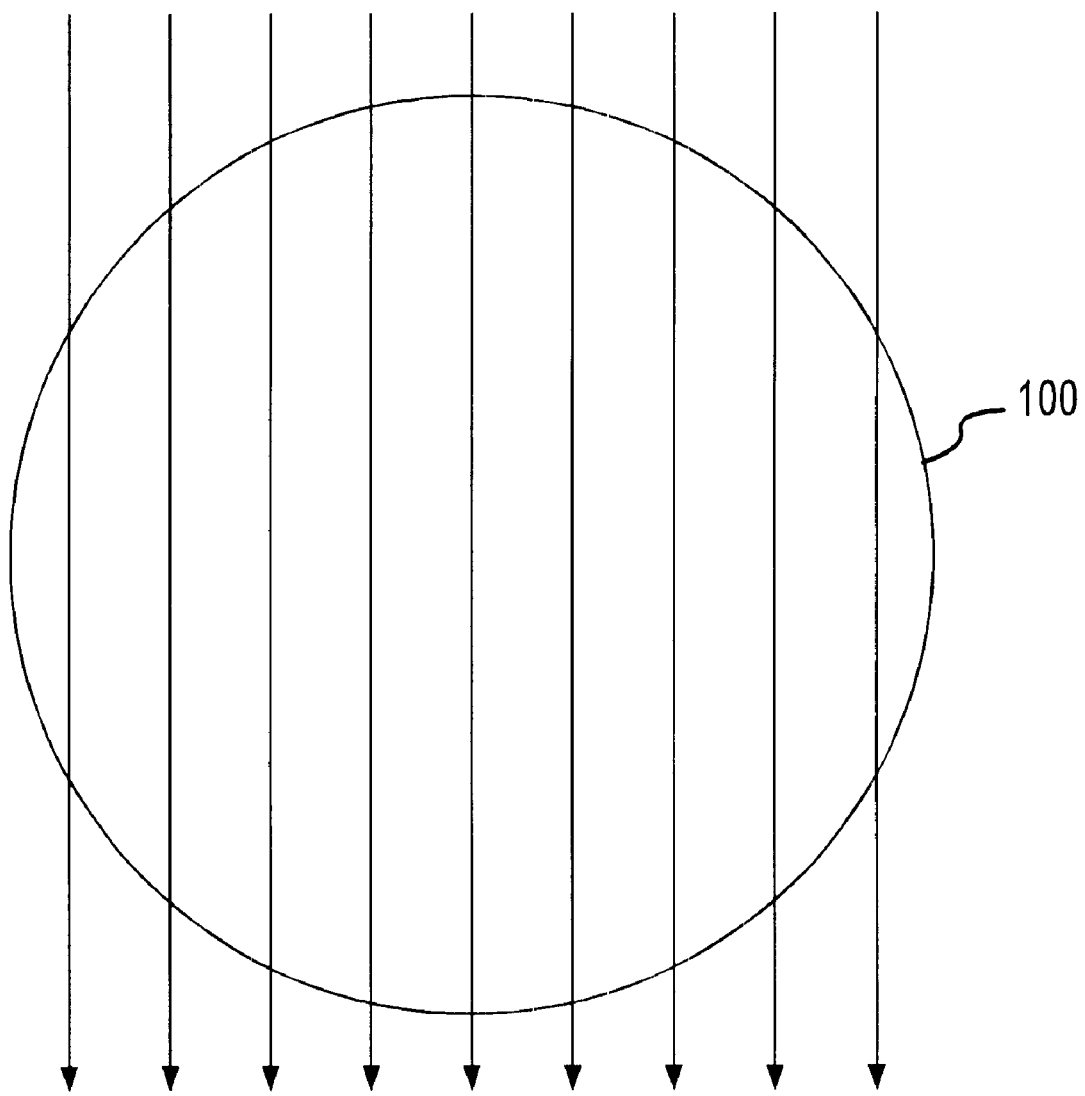
FIG. 6 is a is a top view of a wafer showing parallel axes measured in accordance with the present invention.

In accordance with another aspect of the present invention, preferably, a plurality of arrays 160 are aligned side by side such that multiple parallel axes can be measured across the surface of wafer 101. For example, FIGS. 5 and 6 illustrate the use of nine arrays 160a–i to measures nine parallel axes across the surface of wafer 130. Preferably, arrays 160 are arranged side by side, each spaced apart about 20 mm, though the exact spacing may vary depending on the number of arrays 160 used and the size of wafer 130 measured.

With reference back to FIG. 4, in the preferred embodiment, each output 154 is located at a distinct point on the arc shaped array 160 and directed to a predetermined point of interface on the wafer 101. As wafer 101 passes over window 158, light is directed from output 154 and reflected to a corresponding sensor 162. In the preferred embodiment, sensors 162 are suitably arranged in a symmetrical arc shaped array 164 corresponding to outputs 154. Again, however, as with outputs 154, sensors 162 may be arranged in alternative configurations such as linear and the like.

Each corresponding sensor 162 is a device such as a photoelectric cell which receives the reflected light. Photoelectric cell 162 receives the reflected light and transmits a signal to a data acquisition device 180 which processes the signal corresponding to the reflected light in order to determine the characteristics of the surface of wafer 130. For example, the variation of intensity as a function of angle of incidence allow the determination of various thin film characteristics. Again however, as noted earlier, one skilled in the art will appreciate that alternative metrology/measurement techniques may also be utilized in accordance with the present invention. For example, multiple wavelength normal incidence illumination combined with sensors which measure the intensity of the reflected light would be able to use the information regarding intensity variation as a function of wavelength to determine the desired thin film properties of mean thickness and uniformity.

In accordance with still another aspect of the present invention, a wafer location device 170 is provided to track the position of the wafer passing over measuring device 100. Preferably, referring to FIG. 5, tracking device 170 comprises a light curtain 172 having a light beam 174 and photoelectric cell 176 which detects when wafer 101 is entering and/or leaving measuring device 100. For example, as wafer 101 moves into light curtain 172, wafer 101 blocks and/or interrupts light beam 174 from reaching photoelectric cell 176. The interruption of light beam 174 indicates to the wafer processing system that an edge of the wafer 101 is beginning passage in front of the set of sensors 160a through 160n. Thus, using the speed of wafer 101 passage in front of the sensor assembly 160, in conjunction with the determination of the progression of the wafer's edge through the light curtain 170 the particular area being measured on wafer 101 can be more accurately determined.

Thus, the present invention suitably reduces and/or eliminates the requirement for separate and/or distinct wafer measurement or positioning stations. Additionally, the present invention suitably reduces the amount of handling of wafers processed by the CMP machine. As a result, the throughput and speed of wafers processed by CMP machines is increased yet the number of defects and non-uniformity introduced to those wafers is not substantially increased or even reduced. Additionally, as the device senses the movement and orientation of the wafer, independent from the tools wafer transport system, mechanical and software integration requirements between the process tool and the measurement tool are minimized.

Lastly, it should be apparent that while the principles of the invention have been described in illustrative embodiments, many combination and modification of the above-described steps, structures, arrangements, proportions, the elements, materials and components, used in the practice of the invention in addition to those not specifically described may be varied and particularly adapted for specific environments and operating requirements, without departing from the principles of the present invention. For example, though not specifically described, multiple metrology devices and various alternative locations of metrology device integration may be used.

Likewise, additional measuring devices may be used at various points throughout the wafer processing operations. Thus, many configurations of the present invention, and not just those described above, still fall within the ambit of the appended claims.

I claim:

1. A method of presenting a wafer to a metrology device comprising the steps of:

integrating a photoelectric measurement device between two stations on a wafer processing machine;

transferring a wafer between said two stations such that said wafer passes over said photoelectric measurement device; and measuring a surface of said wafer as said wafer passes over said photoelectric measurement device.

2. The method of claim 1, wherein said photoelectric measurement device is a laser metrology device.

3. The method of claim 1, wherein said photoelectric measurement device comprises a laser output array.

4. The method of claim 3, wherein said laser output array is arranged in an arc shaped configuration.

5. The method of claim 3, wherein said photoelectric measurement device further comprises multiple laser output arrays.

6. The method of claim 5, wherein said multiple laser output arrays are arranged in parallel.

7. The method of claim 1, further comprising the step of providing a wafer tracking device.

8. The method of claim 7, wherein said wafer tracking device is a light curtain.

9. A wafer processing machine comprising:

a first wafer processing station and a second wafer processing station;

a wafer measuring device integrated with the wafer processing machine and located between said first wafer processing station and said second wafer processing station, wherein when a wafer is transferred between said first station and said second station, said wafer measuring device measures a characteristic of said wafer.

10. The wafer processing machine of claim 9, further comprising a wafer tracking device.

11. The wafer processing machine of claim 10, wherein said wafer tracking device is a light curtain.

12. The wafer processing machine of claim 9, wherein said wafer measuring device is a photoelectric measurement device.

13. The wafer processing machine of claim 12, wherein said photoelectric measurement device comprises a laser.

14. The wafer processing machine of claim 12, wherein said photoelectric measurement device comprises a laser output array.

15. The wafer processing machine of claim 14, wherein said laser output array is arranged in an arc shaped configuration.

16. The wafer processing machine of claim 13, wherein said photoelectric measurement device further comprises multiple laser output arrays.

17. The wafer processing machine of claim 16, wherein said multiple laser output arrays are arranged in parallel.

18. A CMP machine comprising:

a first wafer processing station and a second wafer processing station;

an in line metrology device physically integrated with the wafer processing machine and located between said first wafer processing station and said second wafer processing station, wherein when a wafer is transferred between said first station and said second station, said in line metrology device measures a characteristic of said wafer; and a wafer tracking device.

19. The CMP machine of claim 18, wherein said in line metrology device comprises a laser output array arranged in an arc shaped configuration.

20. The wafer processing machine of claim 19, wherein said photoelectric measurement device further comprises multiple laser output arrays arranged in parallel.

* * * * *